United States Patent
Estakhri et al.

[19]

[11] Patent Number: 5,835,935
[45] Date of Patent: *Nov. 10, 1998

[54] METHOD OF AND ARCHITECTURE FOR CONTROLLING SYSTEM DATA WITH AUTOMATIC WEAR LEVELING IN A SEMICONDUCTOR NON-VOLATILE MASS STORAGE MEMORY

[75] Inventors: Petro Estakhri, Pleasanton; Mahmud Assar, Morgan Hill; Robert Alan Reid, Fremont; Berhanu Iman, Sunnyvale, all of Calif.

[73] Assignee: Lexar Media, Inc., Fremont, Calif.

[*] Notice: This patent issued on a continued prosecution application filed under 37 CFR 1.53(d), and is subject to the twenty year patent term provisions of 35 U.S.C. 154(a)(2).

[21] Appl. No.: 527,484

[22] Filed: Sep. 13, 1995

[51] Int. Cl.$^6$ ...................................................... G06F 12/06
[52] U.S. Cl. ........................................ 711/103; 365/185.11
[58] Field of Search ...................................... 395/430, 405, 395/419, 462; 365/218, 185.11, 185.29, 185.33; 711/103, 5, 135, 209

[56] References Cited

U.S. PATENT DOCUMENTS

| | | | |
|---|---|---|---|
| 5,388,083 | 2/1995 | Assar et al. | 363/218 |
| 5,406,529 | 4/1995 | Asano | 711/103 |
| 5,457,658 | 10/1995 | Niijima et al. | 711/103 |
| 5,479,638 | 12/1995 | Assar et al. | 395/430 |
| 5,485,595 | 1/1996 | Assar et al. | 395/430 |
| 5,524,230 | 6/1996 | Sakaue et al. | 395/430 |
| 5,592,669 | 1/1997 | Robinson et al. | 707/206 |

FOREIGN PATENT DOCUMENTS 0 686 976 A2  12/1995  European Pat. Off. ........ G11C 16/06

Primary Examiner—Eddie P. Chan
Assistant Examiner—Gary J. Portka
Attorney, Agent, or Firm—Claude A. S. Hamrick; Oppenheimer W. Donnelly; Maryam Imam

[57] ABSTRACT

A semiconductor non-volatile mass storage memory is partitioned into user files and system files. The system files partition is further subdivided into clusters, each cluster having a plurality of sectors. Each cluster stores the system file for a single predetermined LBA. As the information within the LBA is changed, the new information is written into an empty sector within the cluster. Once the cluster is filled, the system either erases for recycling the cluster or preferably locates an empty cluster and repeats the process with that new cluster. Once all the clusters are filled, all clusters containing old data are erased for recycling.

22 Claims, 13 Drawing Sheets

| PBA (Cluster location) | most recent location in the cluster | Old | Used | Defect |
|---|---|---|---|---|
| | | | | |
| | | | | |
| | | | | |
| | | | | |
| | | | | |
| | | | | |
| | | | | |
| | | | | |
| | | | | |
| | | | | |
| | | | | |

Table 150:

| PBA (Cluster location) 134 | most recent location in cluster 136 | Old 138 | Used 140 | Defect 142 |
|---|---|---|---|---|
| LBA0/PBA0 → PBA0 | 000 | 0 | 1 | 0 |
| LBA1/PBA1 → PBA1 | 000 | 0 | 1 | 0 |
| LBA2/PBA2 → PBA2 | 000 | 0 | 1 | 0 |
| ... | | | | |
| LBA5/PBA5 → PBA5 | 000 | 0 | 1 | 0 |
| ... | | | | |
| LBAN/PBAN → PBAN | 000 | 0 | 1 | 0 |
| PBA(N+1) → X | 000 | 0 | 0 | 0 |
| PBA(N+2) → X | 000 | 0 | 0 | 0 |
| PBA(N+3) → X | 000 | 0 | 0 | 0 |
| PBA(N+...) → X | 000 | 0 | 0 | 0 |

Table 151:

| PBA (Cluster location) | most recent location in cluster | Old | Used | Defect |
|---|---|---|---|---|
| LBA0/PBA0 → PBA0 | 000 | 0 | 1 | 0 |
| LBA1/PBA1 → PBA1 | 000 | 0 | 1 | 0 |
| LBA2/PBA2 → PBA2 | 001 | 0 | 1 | 0 |
| ... | | | | |
| LBA5/PBA5 → PBA5 | 000 | 0 | 1 | 0 |
| ... | | | | |
| LBAN/PBAN → PBAN | 000 | 0 | 1 | 0 |
| PBA(N+1) → X | 000 | 0 | 0 | 0 |
| PBA(N+2) → X | 000 | 0 | 0 | 0 |
| PBA(N+3) → X | 000 | 0 | 0 | 0 |
| PBA(N+...) → X | 000 | 0 | 0 | 0 |

FIG. 8B

Table 152:

| LBA/PBA | PBA (Cluster location) | most recent location in cluster | Old | Used | Defect |
|---|---|---|---|---|---|
| LBA0/PBA0 | PBA0 | 000 | 0 | 1 | 0 |
| LBA1/PBA1 | PBA1 | 000 | 0 | 1 | 0 |
| LBA2/PBA2 | PBA2 | 010 | 0 | 1 | 0 |
| ... | | | | | |
| LBA5/PBA5 | PBA5 | 000 | 0 | 1 | 0 |
| ... | | | | | |
| LBAN/PBAN | PBAN | 000 | 0 | 1 | 0 |
| PBA(N+1) | X | 000 | 0 | 0 | 0 |
| PBA(N+2) | X | 000 | 0 | 0 | 0 |
| PBA(N+3) | X | 000 | 0 | 0 | 0 |
| PBA(N+...) | X | 000 | 0 | 0 | 0 |

Table 153:

| LBA/PBA | PBA (Cluster location) | most recent location in cluster | Old | Used | Defect |
|---|---|---|---|---|---|
| LBA0/PBA0 | PBA0 | 000 | 0 | 1 | 0 |
| LBA1/PBA1 | PBA1 | 000 | 0 | 1 | 0 |
| LBA2/PBA2 | PBA2 | 011 | 0 | 1 | 0 |
| ... | | | | | |
| LBA5/PBA5 | PBA5 | 000 | 0 | 1 | 0 |
| ... | | | | | |
| LBAN/PBAN | PBAN | 000 | 0 | 1 | 0 |
| PBA(N+1) | X | 000 | 0 | 0 | 0 |
| PBA(N+2) | X | 000 | 0 | 0 | 0 |
| PBA(N+3) | X | 000 | 0 | 0 | 0 |
| PBA(N+...) | X | 000 | 0 | 0 | 0 |

| LBA | PBA (Cluster location) | most recent location in cluster | Old | Used | Defect |
|---|---|---|---|---|---|
| LBA0/PBA0 | PBA0 | 000 | 0 | 1 | 0 |
| LBA1/PBA1 | PBA1 | 000 | 0 | 1 | 0 |
| LBA2/PBA2 | PBA2 | 100 | 0 | 1 | 0 |
| ... | | | | | |
| LBA5/PBA5 | PBA5 | 000 | 0 | 1 | 0 |
| ... | | | | | |
| LBAN/PBAN | PBAN | 000 | 0 | 1 | 0 |
| PBA(N+1) | X | 000 | 0 | 0 | 0 |
| PBA(N+2) | X | 000 | 0 | 0 | 0 |
| PBA(N+3) | X | 000 | 0 | 0 | 0 |
| PBA(N+...) | X | 000 | 0 | 0 | 0 |

155:

| LBA | PBA (Cluster location) | most recent location in cluster | Old | Used | Defect |
|---|---|---|---|---|---|
| LBA0/PBA0 | PBA0 | 000 | 0 | 1 | 0 |
| LBA1/PBA1 | PBA1 | 000 | 0 | 1 | 0 |
| LBA2/PBA2 | PBA2 | 101 | 0 | 1 | 0 |
| ... | | | | | |
| LBA5/PBA5 | PBA5 | 000 | 0 | 1 | 0 |
| ... | | | | | |
| LBAN/PBAN | PBAN | 000 | 0 | 1 | 0 |
| PBA(N+1) | X | 000 | 0 | 0 | 0 |
| PBA(N+2) | X | 000 | 0 | 0 | 0 |
| PBA(N+3) | X | 000 | 0 | 0 | 0 |
| PBA(N+...) | X | 000 | 0 | 0 | 0 |

| | PBA (Cluster location) | most recent location in cluster | Old | Used | Defect |
|---|---|---|---|---|---|
| LBA0/PBA0 | PBA0 | 000 | 0 | 1 | 0 |
| LBA1/PBA1 | PBA1 | 000 | 0 | 1 | 0 |
| LBA2/PBA2 | PBA2 | 110 | 0 | 1 | 0 |
| ... | | | | | |
| LBA5/PBA5 | PBA5 | 000 | 0 | 1 | 0 |
| ... | | | | | |
| LBAN/PBAN | PBAN | 000 | 0 | 1 | 0 |
| PBA(N+1) | X | 000 | 0 | 0 | 0 |
| PBA(N+2) | X | 000 | 0 | 0 | 0 |
| PBA(N+3) | X | 000 | 0 | 0 | 0 |
| PBA(N+...) | X | 000 | 0 | 0 | 0 |

157 →

| | PBA (Cluster location) | most recent location in cluster | Old | Used | Defect |
|---|---|---|---|---|---|
| LBA0/PBA0 | PBA0 | 000 | 0 | 1 | 0 |
| LBA1/PBA1 | PBA1 | 000 | 0 | 1 | 0 |
| LBA2/PBA2 | PBA2 | 111 | 0 | 1 | 0 |
| ... | | | | | |
| LBA5/PBA5 | PBA5 | 000 | 0 | 1 | 0 |
| ... | | | | | |
| LBAN/PBAN | PBAN | 000 | 0 | 1 | 0 |
| PBA(N+1) | X | 000 | 0 | 0 | 0 |
| PBA(N+2) | X | 000 | 0 | 0 | 0 |
| PBA(N+3) | X | 000 | 0 | 0 | 0 |
| PBA(N+...) | X | 000 | 0 | 0 | 0 |

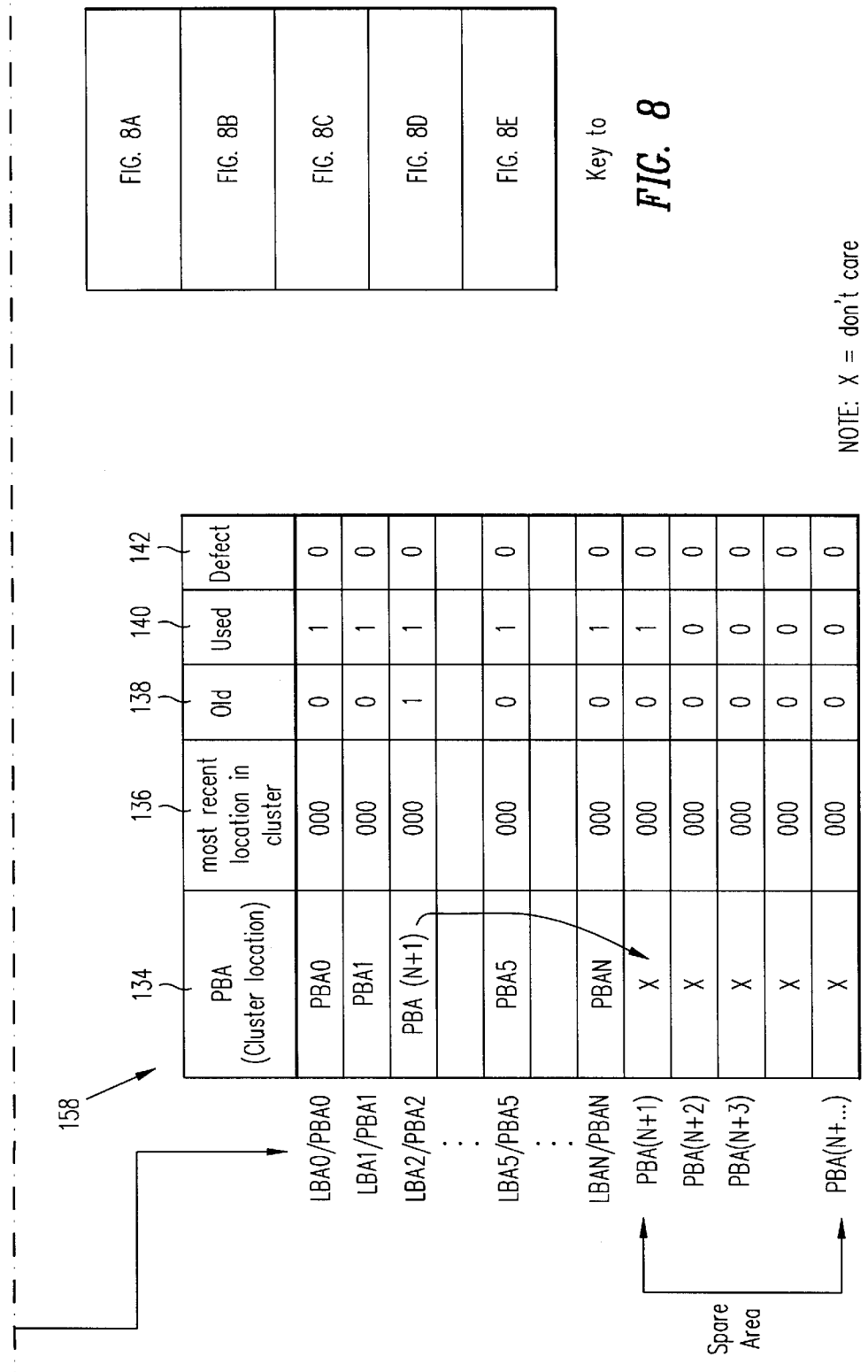

METHOD OF AND ARCHITECTURE FOR CONTROLLING SYSTEM DATA WITH AUTOMATIC WEAR LEVELING IN A SEMICONDUCTOR NON-VOLATILE MASS STORAGE MEMORY

FIELD OF THE INVENTION

This invention relates to the field of semiconductor mass storage architectures and methods of operating therefor. More particularly, this invention relates to the field of controlling system data with automatic wear leveling in a semiconductor non-volatile mass storage system.

BACKGROUND OF THE INVENTION

Computers conventionally use rotating magnetic media for mass storage of documents, data, programs and information. Though widely used and commonly accepted, such hard disk drives suffer from a variety of deficiencies. Because of the rotation of the disk, there is an inherent latency in extracting information from a hard disk drive.

Other problems are especially dramatic in portable computers. In particular, hard disks are unable to withstand many of the kinds of physical shock that a portable computer will likely sustain. Further, the motor for rotating the disk consumes significant amounts of power decreasing the battery life for portable computers.

Solid state memory is an ideal choice for replacing a hard disk drive for mass storage because it can resolve the problems cited above. Potential solutions have been proposed for replacing a hard disk drive with a semiconductor memory. For such a system to be truly useful, the memory must be non-volatile and alterable. The inventors have determined that FLASH memory is preferred for such a replacement.

FLASH memory is a single transistor memory cell which is programmable through hot electron injection or source injection and erasable through Fowler-Nordheim tunneling. The programming and erasing of such a memory cell requires current to pass through the dielectric surrounding a floating gate electrode. Because of this, such types of memory have a finite number of erase-write cycles. Eventually, the dielectric will fail. Typically, manufacturers of FLASH cell devices specify the limit for the number of erase-write cycles as between 100,000 and 1,000,000.

Another difficulty with some FLASH technologies is the existence of over-erase problems. Devices manufactured using such technologies need to be programmed before erasing to improve uniformity amongst all cells. They also have to be verified for successful erase.

One requirement for a semiconductor mass storage device to be successful is that its use in lieu of a rotating media hard disk mass storage device be transparent to the computer's operating system and the user of a system using such a device. In other words, the designer or user of a computer incorporating such a semiconductor mass storage device could simply remove the hard disk and replace it with a semiconductor mass storage device. All presently available commercial software should operate on a system employing such a semiconductor mass storage device without the necessity of any modification.

Several architectures for a solid state mass storage device have been suggested in the prior art. In particular, two of the present inventors were co-inventors in solutions that are disclosed in U.S. Pat. No. 5,388,083, issued on Feb. 7, 1995; U.S. Pat. No. 5,479,638, issued on Dec. 26, 1995; U.S. Pat. No. 5,485,595, issued on Jan. 16, 1997. and U.S. patent application Ser. No. 08/509,706 filed Jul. 31, 1995. These four patent documents are incorporated herein by reference. These four patent documents are commonly owned and commonly assigned to the same entity as the present application.

Conventional computer systems include a mass storage memory facility for storing user information such as data and applications files (user files). In addition to storing such data and applications files, conventional systems also store non-user information in the mass storage memory facility for use by the computer system in controlling the general operation of the computer and its related peripheral systems (system files). In DOS based systems, such system information includes the boot sector, the FAT tables and the directory information.

According to such conventional systems, the system files are routinely changed significantly more often than the user files. Indeed, for each write of user files, the FAT tables and directory are accessed and written. Within a FLASH memory device, the write and erase operation take the most time to perform. Accordingly, it would be advantageous to not have to perform an erase operation every time a system file is updated. Also, most FLASH memory devices will erase multiple blocks simultaneously. Because, most system file updates are performed in a single sector format, it is desirable to handle system files differently than the data files within the FLASH memory in order to take advantage of a multi-sector erase function. Other approaches have been proposed for handling the writing of information onto a semiconductor mass storage system. However, none of these approaches teaches a method or apparatus which specifically addresses the unique requirements of system files.

SUMMARY OF THE INVENTION

A semiconductor non-volatile mass storage memory is partitioned into user files and system files. The system files partition is further subdivided into clusters, each cluster having a plurality of sectors. Each cluster stores a sector of the system file for a single predetermined LBA. As the information within the LBA is changed, the new information is written into an empty sector within the cluster. Once the cluster is filled, the system either erases for recycling the cluster or preferably locates another empty cluster and repeats the process with that new cluster. Once a cluster is filled, it is either erased or flagged as "old" for erasing later.

BRIEF DESCRIPTION OF THE DRAWINGS

FIG. 7 shows a schematic representation of the block RAM for the present invention.

FIG. 8 illustrates an example of how the entries within the block RAM table are changed in response to a sequence of operations.

DETAILED DESCRIPTION OF THE PREFERRED EMBODIMENT

Figure 1:
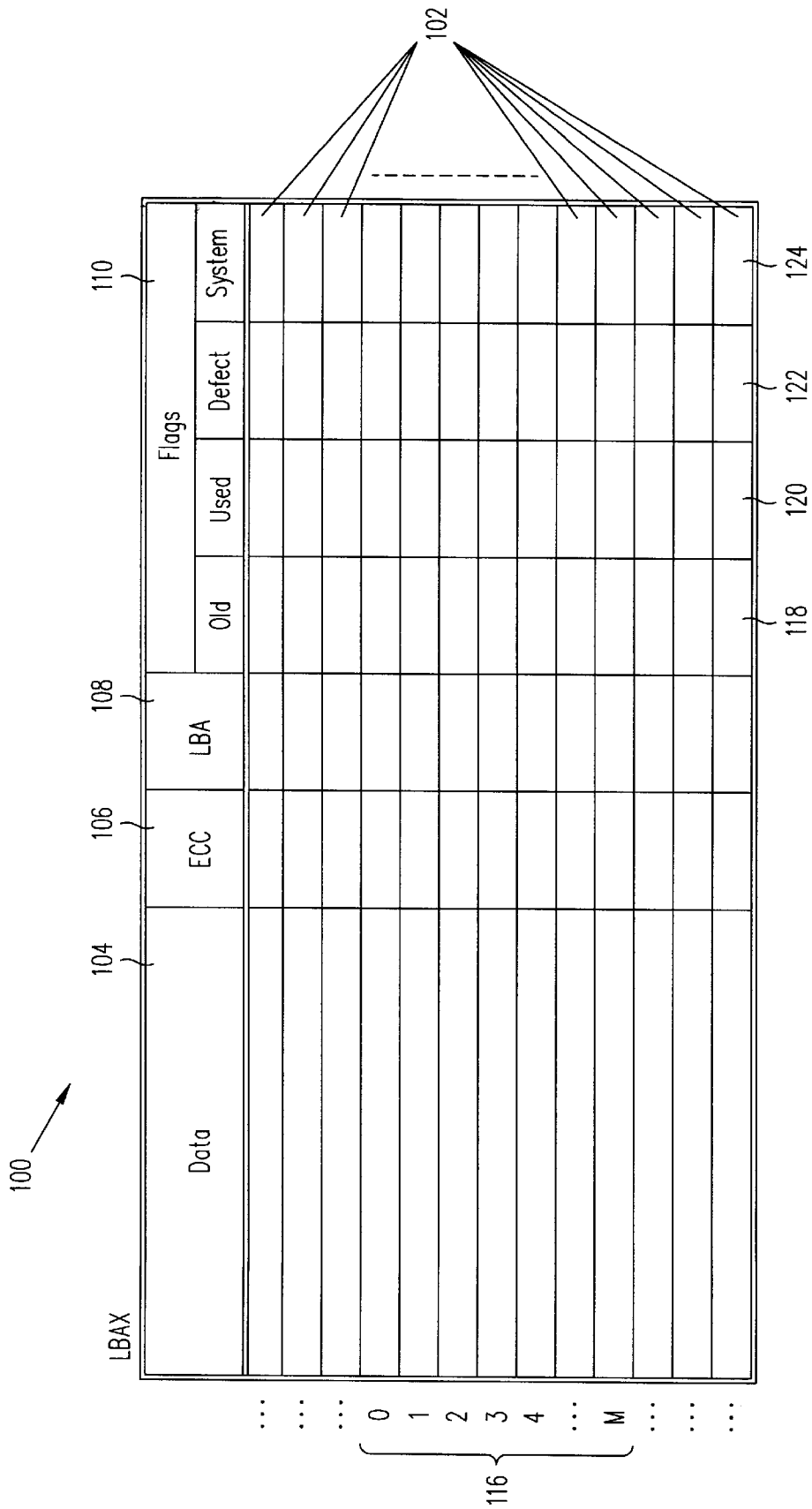
FIG. 1 shows a schematic representation of a semiconductor non-volatile mass storage memory according to the present invention.

The present invention is for a method of and an architecture for controlling system data with automatic wear leveling in a semiconductor non-volatile mass storage memory with improved performance. It will be well understood that the mass storage memory will be coupled to a computer or other digital system which can access the information stored in the mass storage memory. FIG. 1 shows a schematic representation of a cluster within a semiconductor non-volatile mass storage memory according to the present invention. The memory structure is preferably formed of FLASH memory cells. However, it will be apparent to one of ordinary skill in the art that other memory types can be used according to the teachings of the present invention.

The mass storage memory 100 is divided into a plurality of addressable memory portions 102. In the preferred embodiment, each such memory portion 102 is a sector such as addressable in a DOS type application. Other convenient memory sizes can be used. For convenience of understanding, the term sector 102 will be used to discuss these memory portions. Within the mass storage memory 100, the sectors 102 are grouped into clusters 116. Each cluster 116 includes M sectors 102, where M is any convenient size, but is preferably any convenient erasable block size within a chosen flash memory device, such as 8 or 16. Each sector 102 has an associated physical block address (PBA) by which it can be addressed within the mass storage memory 100 for reading, writing or erasing.

Each sector 102 is configured to include several fields. In the preferred embodiment, each sector includes a data field 104 for storing binary information, an error correction field 106 for correcting errors in any known manner, a logical block address LBA 108, and a plurality of flags 110. The LBA 108 is the address assigned to the corresponding data field 104 by the computer system to which the mass storage memory 100 is coupled. The flag field 110 includes at least four subfields: a used flag 120 to indicate whether a sector 102 contains information; an old flag 118 to indicate whether the data within a sector 102 has been replaced; a defect flag 122 to indicate whether the sector 102 is defective; and a system sector flag 124 to indicate whether the cluster 116 is assigned to store a system file.

In the preferred embodiment of the present invention, the old flag 118 is set for the first sector 102 within the cluster when all of the sectors 102 within the cluster have been used and the data within the last sector has been updated and stored in a first sector of a free sector. Also in the preferred embodiment, the defect flag 122 is set for the first sector 102 within the cluster if any of the sectors within the cluster are determined to be defective. When the defect flag 122 is set, the entire cluster is deemed defective and none of the sectors 102 within the cluster are used.

In an alternate embodiment, the old flag 118 can be set for each sector 102 as it is replaced. Also, the defect flag 122 can be set on a sector by sector basis, only for those sectors which are determined to be defective.

Each time the computer updates the system sector associated with a predetermined LBA, it selects the cluster 116 associated with that LBA. Rather than reading the old LBA data, erasing that sector 102, and then restoring the data with the updated information it merely writes the updated information into a next empty sector 102 within the cluster 116. When data is written to the next empty sector 102 within the cluster 116, the used flag 120 is set for that sector. The previous location is known to be old because the last location in the cluster 116 which contains information is the most recent location. The old flag 118 is not set until all of the sectors 102 within the cluster contain data which has been replaced. After the cluster 116 becomes full and the system tries to update the same LBA, the old flag 118 of the first sector within the cluster 116 is set so that the cluster can be subsequently erased and a new free cluster 116 is assigned to the given LBA of the system file. In this manner, an erase operation is not necessary every time a system sector is written. An erase operation of clusters having their old flags set is performed when necessary or in the background by the system.

Figure 2:
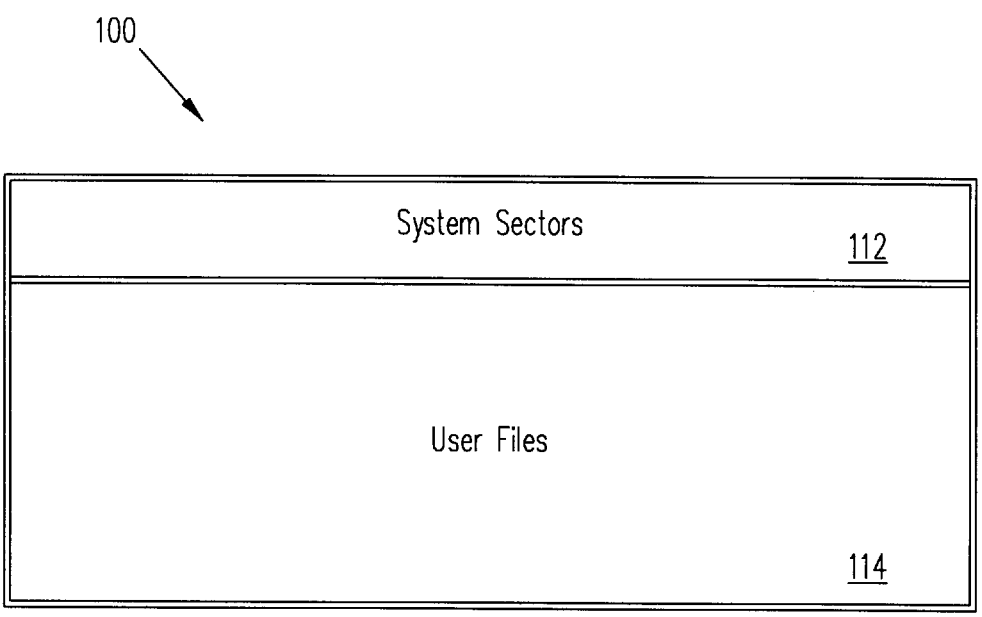
FIG. 2 shows a schematic representation of a partitioning of the semiconductor non-volatile mass storage memory according to the present invention.

According to the present invention, the sectors 102 of the mass storage memory 100 are partitioned into at least two groups. As shown in FIG. 2, a first group 112 of the sectors 102 are reserved for exclusive use as system files. A second group 114 of the sectors 102 are reserved for use as user files and as an extension of the system area.

As is well known, system files are conventionally assigned predetermined LBAs by the computer system. For example, in DOS the first several sectors are reserved for the operating system. In the present invention, a cluster of sectors is reserved for each LBA needed by the operating system for a system file. According to one embodiment of the present invention, if N sectors are needed, then N clusters plus an appropriate number of spares will be reserved in the first group 112.

Figure 3:
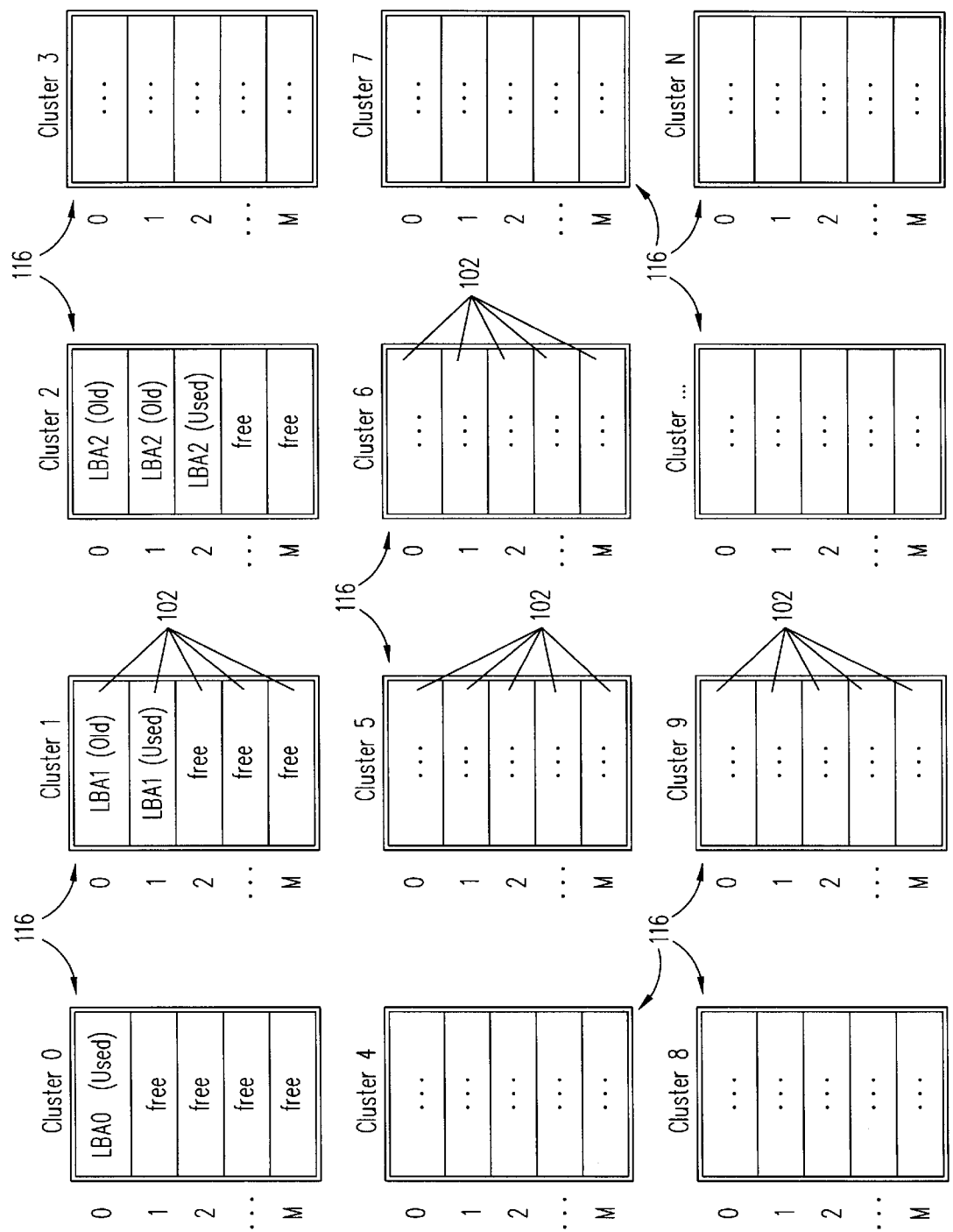
FIG. 3 shows a schematic representation of the cluster arrangement within the system file partition according to one embodiment of the present invention.

FIG. 3 shows a schematic representation of the clusters 116. Each one of the clusters 116 stores a sector associated with a single LBA. Each cluster 116 includes M sectors 102. Only one of the sectors 102 in each cluster 116 will contain the current information. Each sector 102 within each cluster includes the fields illustrated in FIG. 1.

In one embodiment, such as shown in FIG. 3, once the cluster is full the cluster must be marked "old" and another free cluster found before the system sector for that LBA can be updated. This procedure allows those clusters associated with the more often used system sectors to be distributed amongst the clusters assigned to the system area in order that the erase cycles are distributed more evenly among the system clusters.

Figure 4:
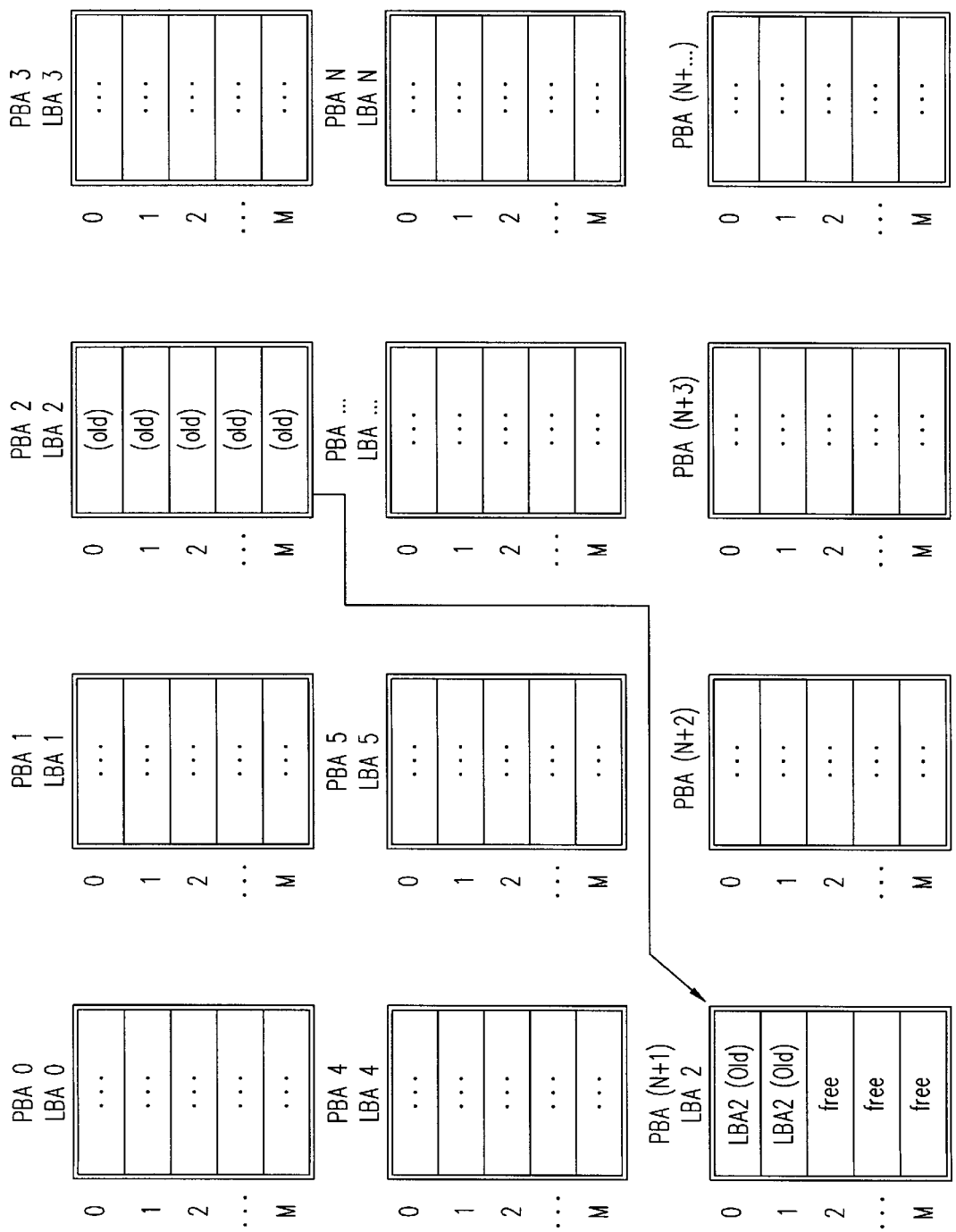
FIG. 4 shows a schematic representation of the cluster arrangement within the system file partition according to the preferred embodiment of the present invention.

FIG. 4 shows a schematic representation of the cluster arrangement within the system partition according to the preferred embodiment of the present invention. Each cluster is assigned a PBA from PBA0 to PBA(N+...). In particular, the first group 112 (FIG. 2) includes extra clusters in excess of the N required by the computer system. Each LBA 0 through N for the system sectors is assigned to a corresponding cluster PBA 0 through N. Consider for example that the system sector associated with the LBA2 is written more often than the other system sectors. Once the cluster 116 for the LBA2 is filled with old system file data, it then is re-directed to an empty available cluster, eg., for PBA (N+1), as shown. The old flag for the first sector of the cluster PBA2 is set to indicate that the sectors within the cluster all contain old data and the cluster PBA(N+1) is assigned to be LBA2.

Figure 5:
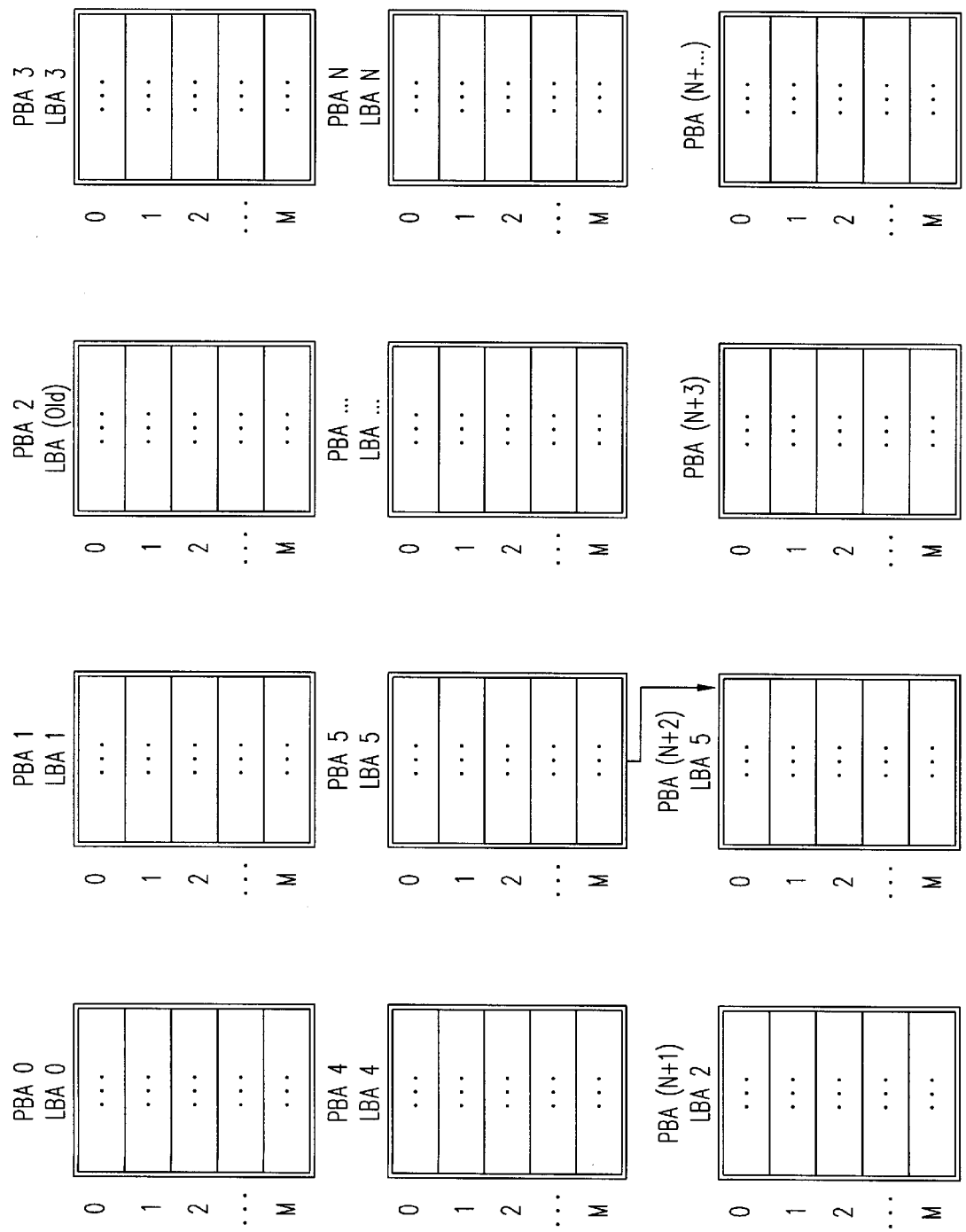
FIG. 5 and FIG. 6 show the arrangement of FIG. 4 after a sequence of operations according to the invention.
Figure 6:
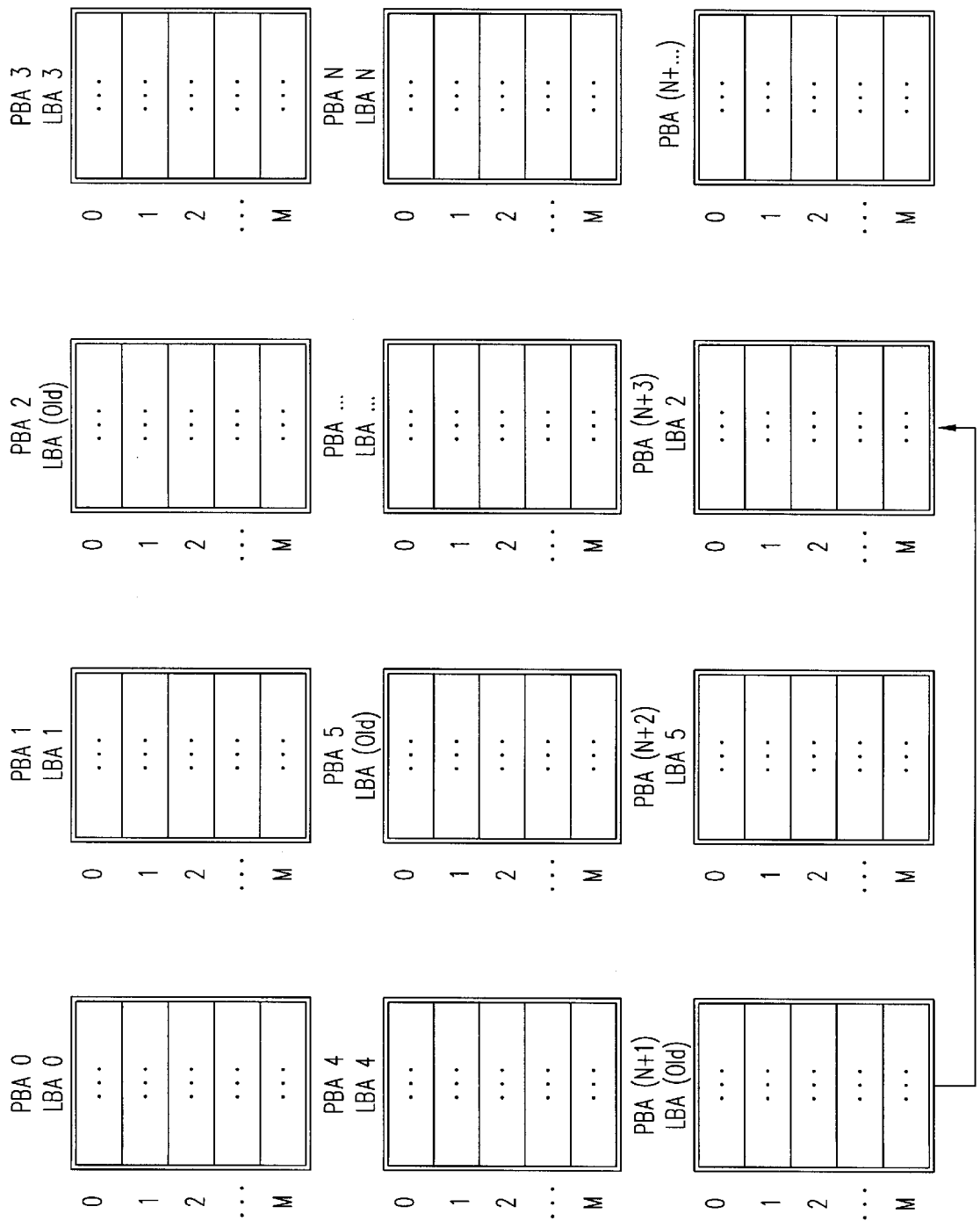

If the system sector associated with LBA5 then fills, the system files for that LBA are then re-directed to another empty available cluster, eg., for PBA(N+2), as shown in FIG. 5. If the system sector associated with LBA2 then fills, the system files for that LBA are then re-directed to another empty available cluster, eg., for PBA(N+3), as shown in FIG. 6. Once the clusters are filled, the 'old' clusters are erased and reused in this same way. The system can also perform an erase of all the 'old' clusters in the background, while another operation is being performed, so it can have an empty cluster available to it at all times. This would further increase the performance of the overall system. This procedure provides for automatically ensuring that the program and erase cycles in the system file partition of the semiconductor non-volatile mass storage memory remains approximately constant for all the sectors and clusters.

To speed up the operation of the present invention, a block RAM is included and used to store a table representing the LBAs, corresponding PBAs and relevant data. FIG. 7 shows a schematic representation of the table 144 stored within the block RAM for the present invention. The block RAM table includes an entry 132 for each LBA in the system file partition plus some spare locations for increased performance. The entries for each LBA 0 through N are initialized at power up to a corresponding cluster PBA 0 through N by reading the LBA field 108 in the flash extension. An entry for each PBA of the spare clusters is also included within the table. Each entry 132 includes a latest physical block address of the cluster (PBA) field 134 of the information associated with an LBA as well as a mirror of the old flag 138, the used flag 140, and the defect flag 142 associated with the actual physical block address of the cluster in the semiconductor non-volatile mass storage memory. Also, the field 136 represents the most recent data or sector within the given physical block address associated with the given LBA. Therefore, if the block size (cluster size) is 8, and for example the most recent sector within this cluster is 5, the field 136 is loaded with the value 5. This will help the controller during an access to locate the most recent sector within the cluster. Alternatively, this field can also be removed if the controller reads every sector within the cluster to locate the most recent system file.

Within the table 144 each entry within the fields 134 and 136 corresponds to an LBA. The PBA field 134 contains the current PBA of the cluster 116 which includes the current data for the corresponding LBA. The field 136 contains the number of the sector within the cluster which is storing the current data. The flag fields 138, 140 and 142 correspond to the assigned PBA for each entry. The old flag field indicates that the assigned PBA for that entry is old and needs to be erased. When an erase operation is performed, the system of the present invention searches the table within the block RAM for PBAs with their old flags set. The used flag field 140 mirrors the used flag 120 of the first sector within the cluster corresponding the PBA and is set when data is stored within that cluster. The defect flag field indicates that the assigned PBA cluster is defective.

FIG. 8 illustrates an example of the host system accessing several LBA's and how it is handled in the table stored within the block RAM. For example, if initially the host writes all the LBAs 0 through N, and if the mass media is not used, the LBA0 will point to PBA0, LBA1 to PBA1, . . . and LBAN to PBAN as shown in the table 150. For each of the entries corresponding to the LBAs 0–N, the used flag 140 within the table 150 is set. The most recent location in the cluster field 136 for each entry in the table corresponding to the LBAs 0–N will be loaded with all zero's since the 1st location in each block is the most recent system data file. Each of the tables 150–158 illustrate a progression of the entries within the table stored within the block RAM in response to a series of operations. If the host system performs a write operation to the LBA2 again, the data will be written to the next sector within the cluster PBA2 and the most recent location in the cluster field 136 within the table 151 is updated to 001. The used flag 120 will also be set in the sector extension in the non-volatile memory 100. As the system keeps writing to the LBA2, this process continues until the most recent location in cluster field 136 is updated to 111 as shown in the table 157. Then, the next time the host system performs a write operation to the LBA2 again, the old flag 118 of the first sector within the cluster PBA2 is set to 1, the old flag within the old flag field 138 corresponding to the PBA2 is set to 1, the PBA field 134 corresponding to the entry LBA2 in the table 158 will be updated with the next available free cluster, which is PBA (N+1) and the used flag field 140 corresponding to the entry for the free cluster PBA(N+1) is set to 1. Then, the most recent location in the cluster field 136 is reset to 000. The next available free cluster is found by searching the clusters for a cluster which includes a first sector in which the used and defect flags are not set. When a cluster is erased the old and used flags are reset within the cluster 116 and within the table 144. This cluster is then added to the pool of free clusters.

Figure 9:
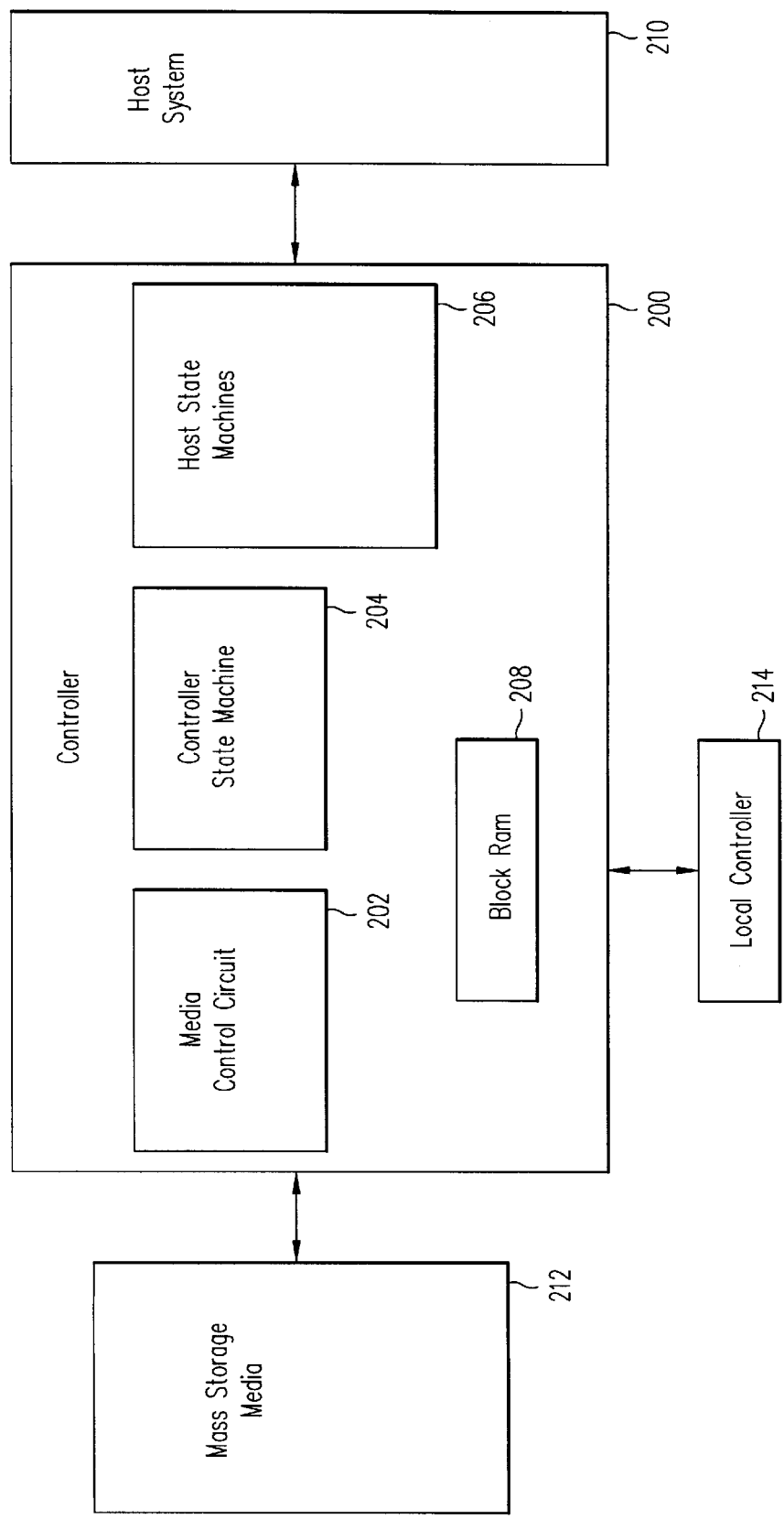
FIG. 9 illustrates a block diagram schematic of a mass storage memory control circuit of the present invention.

A control circuit, as illustrated in FIG. 9, is configured for reading the flags and receiving data requests from the computer system for controlling the operations of the semiconductor non-volatile mass storage memory described herein. The control circuit 200 is coupled to the mass storage media 212, to the host system 210 and to a local controller 214 for controlling the operations between the host system 210 and the mass storage media 212. The control circuit 200 includes a media control circuit 202, a controller state machine 204, one or more host state machines 206 and a block RAM 208. The media control circuit 202 controls and provides the interface to the mass storage media 212. The host state machine 206 controls and provides the interface to the host system 210. The controller state machine 204 controls the operation of the control circuit 200. The block RAM 208 is used to store the table 144, as described above.

The table 144 is stored within the block RAM 208 which is volatile memory. Therefore, when the power to the system is turned off, the data stored within the table 144 is lost. Accordingly, when power is restored to the system the data has to be restored or reloaded into the table 144. In order to reload the data within the table 144, each cluster which includes a system sector is read and the data from each sector is used to build the table 144. Only system clusters in which the old flag 118 and/or the defect flag 122 of the first sector is not set, are read. Each sector includes an LBA field 108 which is used to correlate a PBA with each LBA. This PBA is then stored within the PBA field 134 of the table 144 for a corresponding LBA entry. The entry for the most recent location in the cluster field 136 is determined by finding the last sector in the cluster which has its used flag 120 set. In this manner, this process is repeated for each current cluster storing a system sector until the table 144 is rebuilt.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A mass storage system comprising:
   at least one semiconductor non-volatile memory means having a plurality of individually addressable sector storage locations for storing information; and a controller circuit coupled to said memory means and operative to define a first partition within said memory means having sector storage locations for storing user files, and a second partition within said memory means having sector storage locations for storing system files, the sector storage locations of said second partition being grouped in a plurality of clusters, each said cluster being uniquely identifiable by a predetermined logical block address, said controller circuit being further operative upon initial access of a particular cluster identified by a particular logical block address to store a first system sector information in one of the sector storage locations of the particular cluster, and upon subsequent accesses of the particular cluster identified by the particular logical block address, the controller circuit further being operative to store replacement system sector information into an empty sector storage location of the particular cluster, leaving intact the system sector information previously stored in the particular cluster, said controller circuit further being operative to generate an indication for subsequently identifying the location of the most recently stored sector information within the cluster, thereby avoiding the need to erase the memory means every time a cluster identified by a logical block address is re-accessed.

2. The mass storage system as recited in claim 1 wherein the non-volatile memory means includes flash memory devices.

3. The mass storage system as recited in claim 1 wherein upon filling the empty sector storage locations of the particular cluster with replacement system sector information, a subsequent replacement system file is stored in an empty cluster.

4. The mass storage system as recited in claim 1 wherein each of the sector storage locations within a cluster also contains flags indicative of whether the sector information stored in the respective sector storage location is "old."

5. The mass storage system as recited in claim 1 wherein each of the sector storage locations within a cluster also contains a flag indicative of whether the sector information stored in the respective sector storage location is "used."

6. The mass storage system as recited in claim 1 wherein each of the sector storage locations within a cluster further contains a flag indicative of whether the sector information stored in the respective sector storage location is "defective."

7. A mass storage system as recited in claim 1, wherein said indication includes an address of the storage location wherein the mot recently stored sector information resides within the particular cluster.

8. A mass storage system as recited in claim 7 wherein the address of the storage location of the most recently stored sector information stored within the particular cluster is incremented each time the particular cluster identified by the logical block address is re-accessed.

9. A mass storage system as recited in claim 1 wherein each logical block address is stored in a particular one of the sector storage locations of a corresponding cluster.

10. A memory system for storing data comprising:

a semiconductor non-volatile mass storage memory partitioned into at least two areas, one of which includes sector storage locations used to store system files, a predetermined plurality of said sector storage locations of said one area being grouped in clusters, each said cluster being uniquely identifiable by a predetermined logical block address, a first sector storage location of a particular cluster being used for storing system sector information upon initial access of the particular cluster, and upon re-accesses of the particular cluster, prior to erasure of the particular cluster's sector information, subsequent sector storage locations of the particular cluster being used for storing replacement system sector information; and a control circuit coupled to the semiconductor non-volatile mass storage memory for controlling the partitioning thereof, for storing system sector information within the cluster, and for storing replacement system sector information within the cluster while leaving intact the system sector information previously stored in the particular cluster, said control circuit further being operative to generate an indication of the location of the most recent sector information stored within the particular cluster, thereby avoiding the need to erase the non-volatile mass storage memory every time a cluster identified by a logical block address is re-accessed.

11. The memory system as recited in claim 10 wherein said mass storage memory is flash memory.

12. The memory system as recited in claim 10 wherein a write operation is completed by writing replacement system sector information into an empty sector storage location within the cluster corresponding to an appropriate logical block address.

13. A memory system as recited in claim 10 wherein said semiconductor non-volatile mass storage memory further includes an empty cluster for storing a subsequent replacement system file when a previous cluster is filled.

14. A memory system as recited in claim 10 further including a table storage device for storing a table of information, the table storage device being operative to translate an input logical block address to a corresponding physical block address that can be used to address said mass storage memory.

15. A memory system as recited in claim 14 wherein the table storage device is a random access memory.

16. A memory system as recited in claim 14 wherein the table of information is updated by reading system sector information in clusters identified by logical block addresses and modifying the table entries to reflect current logical block address to physical block address relationships.

17. A memory system as recited in claim 11 wherein each entry within the table contains a flag indicative of whether or not the sector information stored in the respective sector storage location is "used".

18. A memory system as recited in claim 11 wherein each entry within the table contains a flag indicative of whether or not the sector information stored in the respective sector storage location is "defective".

19. A memory system as recited in claim 15 wherein each entry within the table further includes an indication of a current sector within a cluster corresponding to a logical block address.

20. A method of storing information in a semiconductor nonvolatile mass storage memory adapted to store information in sector storage spaces, comprising:

partitioning the memory into a first group of sector storage spaces for storing a plurality of user files and a second group of sector storage spaces for storing a plurality of system files;

combining the sector storage spaces of the second such group into clusters of storage spaces, each such cluster being uniquely identifiable by a logical block address and used for storing a current system sector within one of the sector storage spaces in that cluster;

storing a system file in a particular one of said clusters;

determining which sector storage space in the particular cluster is an empty sector storage space;

writing a replacement system file for the stored system file into the empty sector storage space;

providing an indication for identifying the location of the most recently written sector storage space of the particular cluster; and marking the particular cluster as old when a last sector storage space within the particular cluster is replaced and there is no remaining empty sector storage space within the particular cluster.

21. A method of storing information as recited in claim 20 further comprising the step of writing a subsequent replacement system sector into an empty cluster when a previous cluster is filled.

22. A method of storing information as recited in claim 20 further comprising the step of erasing any clusters having only "old" system sector information.

* * * * *